US009810733B2

(12) United States Patent
Cooper et al.

(10) Patent No.: US 9,810,733 B2
(45) Date of Patent: Nov. 7, 2017

(54) THERMIONIC VALVE TESTER

(71) Applicants: Orange Music Electronic Company Limited, London (GB); KBO Dynamics International LTD., County Durham (GB)

(72) Inventors: Cliff Cooper, Essex (GB); Andrew Fallon, Durham (GB); Colin Arrowsmith, Tyne & Wear (GB)

(73) Assignees: Orange Music Electronics Company Limited (GB); KBO Dynamics International LTD. (GB)

( * ) Notice: Subject to any disclaimer, the term of this patent is extended or adjusted under 35 U.S.C. 154(b) by 469 days.

(21) Appl. No.: 14/386,305

(22) PCT Filed: Mar. 19, 2013

(86) PCT No.: PCT/GB2013/050716
§ 371 (c)(1),
(2) Date: Sep. 18, 2014

(87) PCT Pub. No.: WO2013/140162
PCT Pub. Date: Sep. 26, 2013

(65) Prior Publication Data
US 2015/0042345 A1 Feb. 12, 2015

(30) Foreign Application Priority Data

Mar. 20, 2012 (GB) .................................. 1204876.5
Jan. 23, 2013 (GB) .................................. 1301193.7

(51) Int. Cl.
*G01R 31/25* (2006.01)
*G01R 19/00* (2006.01)
(52) U.S. Cl.
CPC ......... *G01R 31/25* (2013.01); *G01R 19/0092* (2013.01)

(58) Field of Classification Search
CPC ..... G01R 19/0092; G01R 19/00; G01R 31/25
(Continued)

(56) References Cited

U.S. PATENT DOCUMENTS 2,092,896 A 9/1937 Stinchfield
2,616,058 A 10/1952 Wagner
(Continued)

FOREIGN PATENT DOCUMENTS

GB 480752 2/1938
GB 481601 3/1938
GB 620757 3/1949

OTHER PUBLICATIONS

Chinese office Action from corresponding Application No. 201380014762.0, dated Apr. 18, 2016.
(Continued)

*Primary Examiner* — Melissa Koval
*Assistant Examiner* — Courtney McDonnough
(74) *Attorney, Agent, or Firm* — Polster Lieder

(57) ABSTRACT

The thermionic valve tester (10) has a casing (11) and three valve sockets (12) each of which is adapted to receive and has terminals for connection with the electrode pins of different types of thermionic valves. The thermionic valve tester (10) also has a display (13) comprising a series of LED lights, three user operated buttons (16), and a single power supply socket or terminal (14) which supplies power to all components of the valve tester and which is adapted for connection to a low voltage DC power supply lead. Internally, the thermionic valve tester (10) has a plurality of voltage regulators each with a switchable connection to at least one valve electrode terminal of the valve sockets (12) and a memory in which is stored the tests and the performance criteria for different types of thermionic valves. A controller controls connection of the voltage regulators with
(Continued)

the terminals of the valve sockets (12) and the voltages applied to the terminals and also monitors current flow in the thermionic valve during testing. The thermionic valve tester is a small, portable unit which is simple and easy to use and enables people, other than qualified specialists and audio technicians, to regularly monitor valve performance.

31 Claims, 4 Drawing Sheets

(58) Field of Classification Search
USPC .......................................................... 324/405
See application file for complete search history.

(56) References Cited

U.S. PATENT DOCUMENTS

| | | | |
|---|---|---|---|
| 2,926,302 A | | 2/1960 | Morelock |
| 3,202,911 A | * | 8/1965 | Morelock ............... G01R 31/25 324/408 |
| 4,035,710 A | * | 7/1977 | Joyce .................. H02M 3/3388 323/266 |
| 5,144,246 A | * | 9/1992 | Stelloh .................. G01R 31/25 324/405 |
| 2010/0067268 A1 | * | 3/2010 | Kasprzak .............. H02M 3/335 363/74 |

OTHER PUBLICATIONS

International Search Report from corresponding International Application No. PCT/GB2013/050716, dated Jul. 11, 2013.

GB International Search Report from corresponding GB Application No. GB1204876.5, dated Aug. 13, 2012.

K. S. Weaver et al: "Production Testing of Vacuum Tubes", Proc. of the Institute of Radio Engineers, vol. 18, No. 2, Feb. 28, 1930, pp. 336-349.

PCT International Preliminary Report on Patentability from corresponding International Application No. PCT/GB2013/050716, dated Apr. 25, 2014.

* cited by examiner

THERMIONIC VALVE TESTER

CROSS-REFERENCE TO RELATED APPLICATIONS

This application is a National Stage of International Application No. PCT/IGB2013/050716, filed Mar. 19, 2013; which claimed priority to GB 1204876.5, filed on Mar. 20, 2012 and GB 1301193.7, filed on Jan. 23, 2013, the disclosures of which are each incorporated herein by reference.

The present invention relates to apparatus for testing thermionic valves. Particularly, but not exclusively, the present invention relates to apparatus for testing thermionic valves used in audio amplification systems including analogue amplification of musical instruments such as, but not limited to, electric guitars including base guitars.

FIELD OF THE INVENTION

Despite advances in solid state technology for the amplification of audio signals, specialist markets continue to exist for the deployment of thermionic devices, in which amplification is achieved by controlling the flow of electrons in an evacuated valve. Power valves are optimized to produce large current swings at the anode for relatively small control grid signals and it is this large output current that is used to drive a loudspeaker via a matching transformer. Such thermionic devices are usually referred to as valves or tubes and will be referred to herein as thermionic valves. To obtain optimum performance in high quality audio amplifiers, thermionic valves having three, four, five or more active electrodes may be used.

It has become standard practice in guitar amplifiers for the valves to be overdriven, well beyond their recommended operating conditions. This results in distortion of the audio signal which is embraced as enhancing the overall musical effect; the amplification system effectively becoming part of the instrument. Whilst thermionic valves are very tolerant if their specified operating conditions are temporarily exceeded, thermionic valves can and do 'wear out' and a consequence of driving thermionic valves to and beyond their normal operating conditions in guitar amplifiers is that the valves can rapidly become degraded reducing their lifespan.

Commonly valve amplifiers are operated in a state referred to as class A-B. Class A mode operation of a thermionic valve involves a bias signal being applied to the valve's control grid, an electrode positioned between the cathode and the anode, so that the valve is responsive to both the positive and negative half cycles of an incoming audio signal. In class B mode, a valve pair is used with one valve handling the positive half cycle and a second co-operating valve handling the negative half cycle of the input audio signal. Class A/B mode is a compromise between the linearity of class A and the power saving characteristics of class B.

In class B mode and class A/B mode it is important that the valve pair amplify the individual halves of the split signal by exactly the same amount because this has a huge bearing on the quality of the final re-constructed signal after amplification. Also, the current flow in each valve of a valve pair should be precisely the same because any imbalance causes a net DC current to flow in the output transformer primary windings which will give rise to distortion of the output signal to the loudspeaker and a reduction in audio output power due to transformer core saturation. Although a pair of valves may be matched immediately after manufacture, the valves may deteriorate at different rates during their lifespan resulting in variation between their individual performances.

An important feature of any thermionic valve circuit is its biasing. A negative voltage applied to the valve's control grid will restrict or prevent current flowing between the anode and the cathode. This negative voltage applied to the valve's control grid is referred to as a bias signal and is used to control the amount of current which flows under no-audio-signal conditions, otherwise referred to as quiescent conditions. In class A/B mode a relatively small amount of DC current is allowed to flow in each valve to reduce distortion of the amplified signal to a low level in quiescent conditions. The amount of quiescent current allowed to flow is important in maintaining optimum operating conditions: too much current will cause harmonic distortion, increase heat dissipation in the anode, reduce audio output power and reduce the operational life of the valve. Too little current will also cause harmonic distortion and, under extreme conditions, could cause a condition know as cathode poisoning which also reduces the effective operating life of the valve.

There are two conventional biasing methods: cathode or automatic bias and fixed bias. Fixed bias tends to be the preferred method in high power amplifiers and guitar amplifiers. With a fixed bias, an external negative supply is connected to each of the control grids of the amplifier's valves and the negative supply is manually adjusted using a trimmer resistor. Usually, the external negative supply is common to a plurality of the valves in the amplifier so that the same manual adjustment is applied to each of the valves. Normally, an optimum level of bias is initially determined when the amplifier is first manufactured.

DESCRIPTION OF THE RELATED ART

In GB 2462368 a method and apparatus are described for regular adjustment of the level of the bias signal applied to the control grid of a thermionic valve to maintain optimum performance of the valve during the lifespan of the valve. The method involves measuring the output current between the cathode and the anode of the valve when in quiescent conditions; comparing the measured current to a preferred current value; and adjusting the grid bias voltage so as to adjust the measured output current until it matches the preferred current value. However, the method and apparatus described in this document do not provide for testing of the thermionic valve and only provide for adjusting the bias signal to the valve's control grid in order to maintain optimal performance.

GB 481601 describes conventional tests suitable for thermionic valves and a tester for performing such tests. The tester has an array of sockets and a series of cards with each card having a different arrangement of holes punched. The holes align with individual sockets in the tester and in this way each card provides access to a different series of sockets for a particular test and bars access to any sockets which are not required for that particular test.

In GB 480752, GB 620757, U.S. Pat. No. 2,092,896, U.S. Pat. No. 2,926,302 and U.S. Pat. No. 3,202,911 methods and apparatus for testing valves are described. In each case the apparatus requires a standard AC power source and utilises a series of regulator valves, in the form of the secondary windings of a plurality of transformers, with different tapping points, to deliver a range of different DC voltages required for the valve tests. There are significant risks associated with a power valve failing during use, for example on stage at a concert, and degradation of or damage to thermionic valves may not always be audibly apparent when a valve is in use in an amplifier. However the testing of thermionic valves for degradation and damage tends to be limited to qualified specialists and audio technicians. There is, therefore, a need to provide a simple and convenient way for regular testing of thermionic valve performance.

SUMMARY OF THE INVENTION

According to a first aspect of the present invention there is provided a thermionic valve tester comprising: at least one valve socket having a plurality of valve electrode terminals adapted for connection with the electrodes of a thermionic valve; a single power supply socket adapted for connection to an external power supply; a first voltage regulator having a switchable connection with at least one valve electrode terminal of the valve socket, the voltage regulator being adapted to supply at least two different predetermined valve electrode voltages; a controller for controlling connection of the first voltage regulator with at least one of the valve electrode terminals and for monitoring current flow in a thermionic valve mounted in the valve socket; and a display in communication with the controller for displaying the test results for a thermionic valve, wherein the power supply terminal is adapted for connection to an external low voltage DC power supply.

Ideally the testing device further comprises a second voltage regulator having a switchable connection with at least one valve electrode terminal of the valve socket, wherein the single power supply socket supplies power to both the first and second voltage regulators.

In a preferred embodiment the first voltage regulator is a switched voltage regulator including a transistor and the controller is adapted to control the pulse width of the transistor so as to alter the voltage supplied by the first voltage regulator to at least one of the valve electrode terminals. Furthermore, the first voltage regulator may be adapted to supply a pulsed HT voltage to a valve anode terminal and the controller may be adapted to monitor current flow in the thermionic valve in response to the pulsed HT voltage, the current flow being representative of thermionic emission of the valve cathode. This enables power to be supplied to the valve electrodes efficiently and in a highly controllably manner and without the disadvantages common to linear regulators of poor efficiency, size and weight so that the valve tester may be easily portable.

Preferably the second voltage regulator has a switchable connection with a valve heater terminal in the valve socket, the second switched voltage regulator having a transistor and the controller is adapted to control the pulse width of the transistor and to monitor current flow from the second voltage regulator to the valve heater terminal and wherein the controller is further adapted to shut down current supply from the second switched voltage regulator to the valve heater terminal when a high current flow to the valve heater terminal, representative of a short circuit in the valve heater, is detected by the controller. This enables power to be supplied to the valve heater efficiently and in a highly controllably manner and without the disadvantages common to linear regulators of poor efficiency, size and weight.

In a particularly preferred embodiment the controller further includes a timer and the controller is adapted to delay shutting down current supply to the valve heater terminal for a predetermined time period after high current flow representative of a short circuit is detected. In this way, high inrush currents when a heater is first started can be accommodated by the valve tester so as to avoid false positive test results of a short circuit in the heater.

The valve tester may further comprise a memory in which is stored: a plurality of different valve tests, each stored valve test including voltage settings for the valve electrodes; and the controller may be adapted to access at least one of the valve tests from memory and to cause the first voltage regulator to supply an electrode terminal with a voltage according to the voltage settings for the valve test. Also, the memory may have stored within it one or more expected performance characteristics for a thermionic valve in response to one or more valve tests and the controller may be further adapted to: monitor the performance of a thermionic valve being tested; compare the monitored performance with the stored expected performance characteristics; and output the result of the comparison. With this embodiment a valve tester is provided that is safe and easily used even by people lacking the level of technical knowledge required with conventional valve testers.

The controller may be further adapted to calculate a condition value and to cause the condition value to be displayed by the display, the condition value being based upon the difference between the monitored performance of a valve in response to one or more valve tests and stored expected performance characteristics. Ideally the condition value is representative of two valves of the same type being matched where each valve has the same condition value. Thus the valve tester enables valves of the same type to be matched without users of the valve tester having any specialist technical knowledge.

The controller is ideally in the form of a processor adapted to perform programmed instructions stored in a program memory. The various valve tests may therefore be stored as one or more algorithms optimized for individual valve types and to minimize power consumption.

In a separate aspect the present invention provides a method of testing a thermionic valve using a valve tester, the method comprising the steps of: connecting a single power supply terminal of the valve tester to a low voltage DC power supply; connecting the pins of a thermionic valve to the electrode terminals in a valve socket of the valve tester; supplying from a first voltage regulator to at least one of the electrode terminals a first voltage which is different from the low voltage DC power supply and thereafter supplying from the first voltage regulator to at least one of the electrode terminals a second voltage which is different from both the first voltage and the low voltage DC power supply; monitoring current flow in the thermionic valve; and displaying the results of the test.

Preferably power is supplied from the power supply terminal to the first voltage regulator and to a second voltage regulator and the method further comprises supplying from the second voltage regulator to at least one of the electrode terminals a third voltage which is different from the low voltage DC power supply and the first and second voltages In a particularly preferred embodiment the step of supplying a first voltage to at least one of the electrode terminals and thereafter supplying a second voltage to at least one of the electrode terminals comprises adjusting a switched voltage regulator by controlling the pulse width of a transistor of the switched voltage regulator.

This particularly preferred method may further comprise supplying a pulsed HT voltage to a valve anode terminal and monitoring current flow in the thermionic valve in response to the pulsed HT voltage, the current flow being representative of thermionic emission of the valve cathode.

Preferably the method additionally comprises supplying a voltage to a valve heater terminal in the valve socket using a second switched voltage regulator, monitoring current flow from the second switched voltage regulator to the valve heater terminal and shutting down the current supply from the second switched voltage regulator to the valve heater terminal by adjusting the pulse width of a transistor of the second switched voltage regulator when a high current flow to the valve heater terminal representative of a short circuit in the valve heater is detected. Ideally, the shutting down of the current supply to the valve heater terminal is delayed for a predetermined time period after high current flow representative of a short circuit is detected.

The method also preferably comprises accessing from data storage one or more valve tests each stored valve test including voltage settings for the valve electrodes, and supplying to an electrode terminal a voltage according to the voltage settings for the valve test. Also the performance of a thermionic valve being tested may be monitored and the monitored performance compared with expected performance characteristics stored in the data storage so that the result of the comparison may be outputted. For one group of valve tests the result of the comparison may be one of: Fail, Worn or Good.

Furthermore the method may further comprise determining a condition value and causing the condition value to be displayed on a display of the valve tester, the condition value being based upon the difference between the monitored performance of a valve in response to one or more valve tests and stored expected performance characteristics and ideally the condition value is representative of two valves of the same type being matched where each valve has the same condition value.

In this document, reference to "low voltage" is to be understood as reference to power supply voltages preferably in the range 10-48 volts. Ideally the power supply connector is adapted for connection to a conventional low voltage power supply lead adapted for universal AC input voltages typically, but not limited to, those currently used for laptop and netbook power supplies, for example a 19v DC power supply lead. Alternatively the low voltage power supply may be in the form of a portable battery supply. For example, the valve tester is able to test valves for around 1 hour using only 6×3.7 volt rechargeable batteries.

Thus a method and apparatus for testing thermionic valves is provided which is simple and easy to use and enables people other than qualified specialists and audio technicians to regularly monitor valve performance. The valve tester avoids the use of bulky mains transformers and so is a small, portable or handheld unit requiring only a low voltage power supply, as described above. The valve tester can, therefore, easily be used globally as low voltage power supply leads generally have a universal voltage input. Also, where a battery pack is used to power the valve tester, it could be used in conditions where no mains power supply is available, such as at an outdoor concert venue.

BRIEF DESCRIPTION OF THE DRAWINGS

The present invention will now be described, by way of example only, with reference to the accompanying drawings, in which.

DETAILED DESCRIPTION

Figure 1:
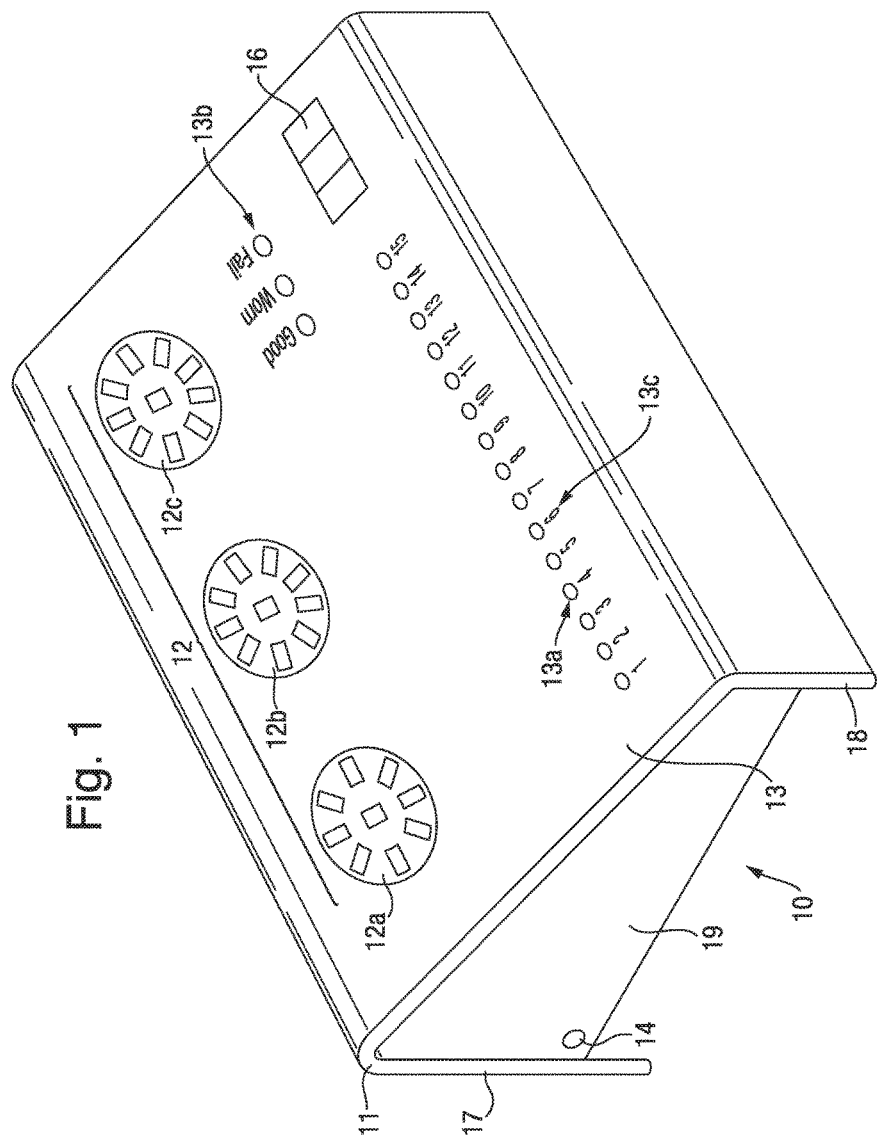
FIG. 1 illustrates a device for testing thermionic valves in accordance with the present invention.

A device 10 for testing thermionic valves is shown in FIG. 1. The testing device 10 includes a casing 11 which is preferably formed of a lightweight material such as, but not limited to aluminium and a plurality of valve sockets 12 (three are shown in FIG. 1) each of which is adapted to receive and has terminals for connection with the electrode pins of a thermionic valve. Each of the valve sockets 12 has a different arrangement of pin holes to accommodate different types of thermionic valves. For example the first socket 12a is an 8 pin socket and is adapted to connect with power valves, whereas the second socket 12b is a 9 pin socket and is adapted to connect with medium power EL84 valves and the third socket 12c is a 9 pin socket but is adapted for connection with pre-amp valves. In this way the three valve sockets illustrated in FIG. 1 are capable of connecting with a large percentage of the thermionic valves currently used in music amplification equipment. Also, socket adapters (not shown) can be used to further extend the range of valves that can be tested using the device 10. Although three sockets are shown in FIG. 1 it should be understood that the testing device 10 may have fewer (e.g. 1 or 2 sockets) or more valve sockets, as desired. Also, although the testing device of FIG. 1 is shown with three different valve sockets, it is also envisaged that the testing device 10 may have a plurality of identical sockets enabling a plurality of valves of the same type to be tested simultaneously.

Figure 3:
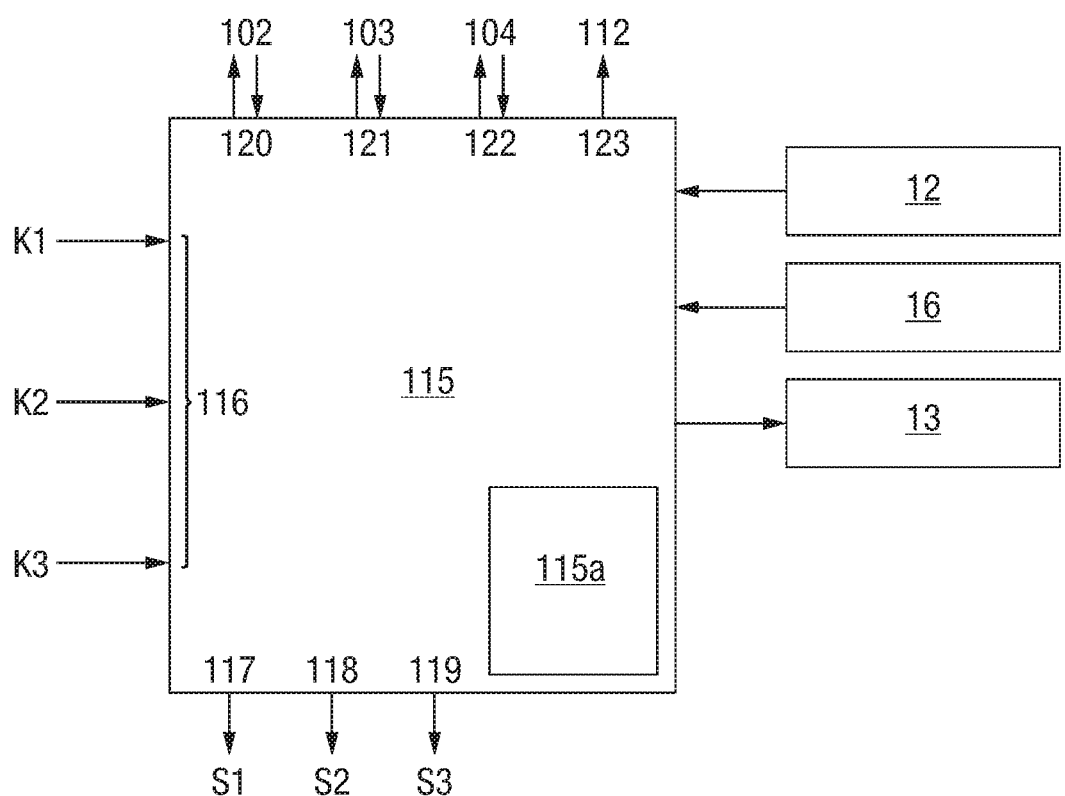
FIG. 3 is a diagram of the controller's data ports of the device of FIG. 1.

The testing device 10 further includes a display 13, a single power supply socket or terminal 14 adapted for connection to a low voltage DC power supply lead 15, the power supply socket 14 supplying electrical power all components of the valve tester, and a plurality of user controls 16 (three are shown in FIG. 3) which are press button switches. Of course, rocker switches and other conventional types of user controls may alternatively be used. The user controls 16 shown in FIG. 1 comprise a central 'Select/Start' button with left- and right-hand directional buttons, either side of the central button. Alternative arrangements of user control buttons and other user control functionality are also envisaged for the testing device 10.

As can be seen in FIG. 1 the casing 11 forms two upstanding walls or legs 17, 18 with the testing device fascia bridging between the two casing walls 17, 18. An electronics housing 19 is mounted beneath the fascia and is supported by the casing walls 17, 18 in spaced relationship above the surface of whatever the testing device 10 stands on. This permits free air circulation around the electronics housing 19. This arrangement assists in preventing overheating of the electronics within the housing 19 and provides impact protection to the electronics housing 19. The electronics housing 19 is preferably formed of a metallic material, such as steel, so as to minimize EMC effects. The testing device 10 is sized so that it can be easily held in one or two hands and as such is manually portable.

With the testing device 10 shown in FIG. 1 the display 13 consists of a plurality of LEDs. Fifteen individual LEDs 13a arranged in a single line and a separate group of three LEDs 13b are shown in FIG. 1. However, it should be understood that the precise number of LEDs and their arrangement is not significant and that fewer or more LEDs and different LED arrangements may be employed in the display 13. Where the valve sockets 12 of the testing device 10 are capable of accommodating a plurality of different valves, individual valve names or codes (not shown) may be printed on the fascia and aligned with respective LEDs in the lines of LEDs 13a.

A string of numbers 13c accompanies the line of LEDs with a different number allocated to each LED 13a, as shown. The LEDs are used to indicate a condition value for a valve being tested (as will be described in greater detail below). This condition value can be used to match the valve with another having the same condition value. The LED display 13 is also capable of indicating whether two halves of a double triode, for example, are matched. The separate group of three status LEDs 13b are used to indicate whether a valve being tested: i) has failed; ii) is worn; or iii) is considered in good condition. Also the LEDs 13b used to indicate valve status may have different colours e.g. red for fail, orange for worn condition and green for good condition. Alternatively the three status LEDs may be omitted and the line of LEDs 13a may be used additionally to indicate valve status. For example, an LED assigned to one of the lower numbers (e.g. 1 or 2) may be used to indicate a failed valve; one or more LEDs assigned to the higher numbers (e.g. 7-15) may be used to indicate a valve in good condition; and one or more LEDs assigned to numbers in the middle of the line, (e.g. 3-6) may be used to indicate a valve that is worn. Although the testing device 10 illustrated in FIG. 1 uses LEDs to communicate the results of the valve tests, alternative display means are envisaged for indicating the results of the tests. Such alternative display means includes, but is not limited to, one or more analogue meter displays or LCD screens etc.

Figure 4:
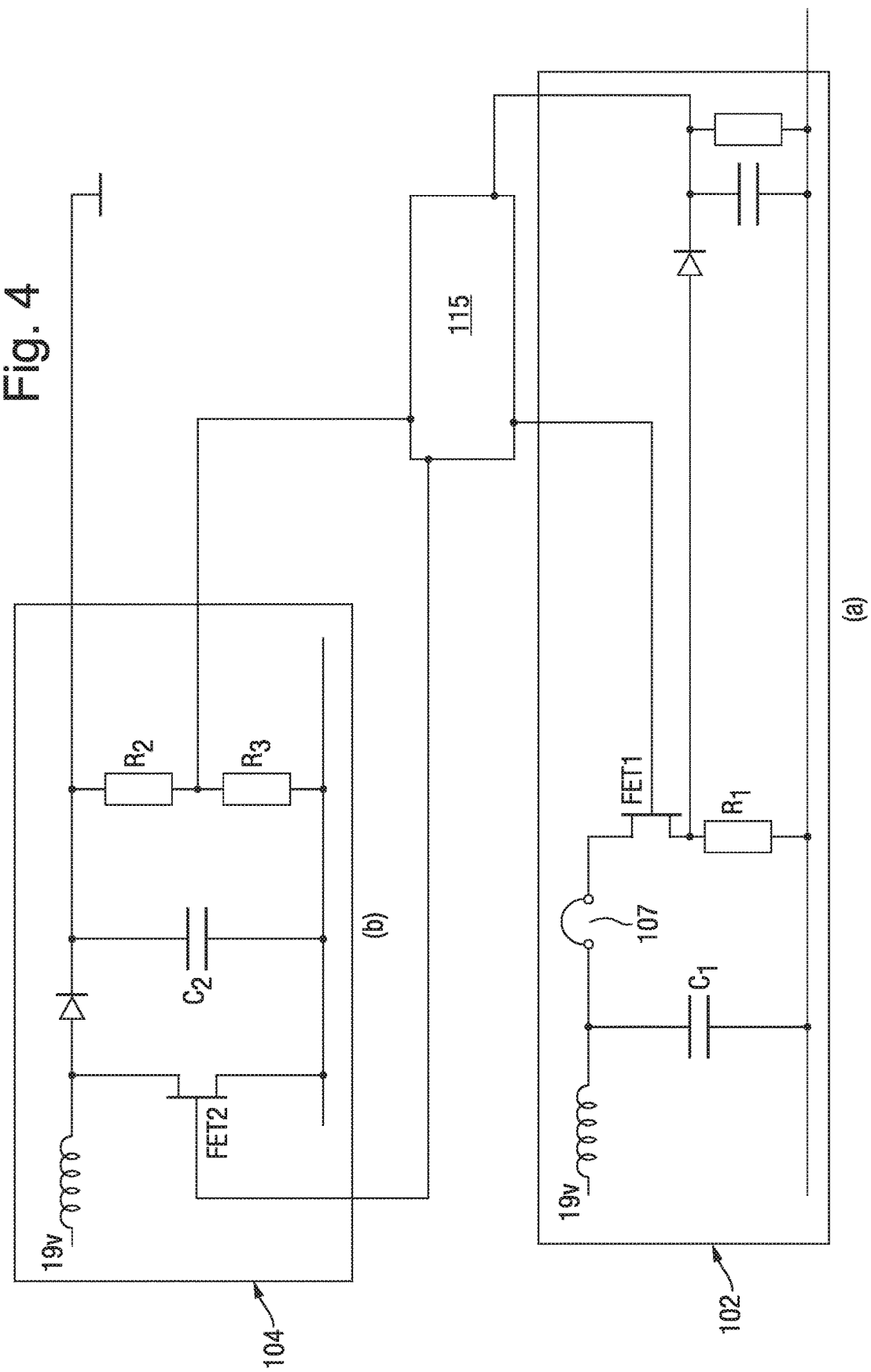
FIGS. 4a and 4b are diagrams of the voltage regulators of FIG. 2.

Within the electronics housing 19 of the testing device 10 two circuit boards are mounted one on top of the other. The uppermost circuit board has or connects with the user controls, the LEDs and the valve sockets whereas the lowermost circuit board has all of the circuitry 100 (which will be described in greater detail below with reference to FIGS. 2 to 4).

Figure 2:
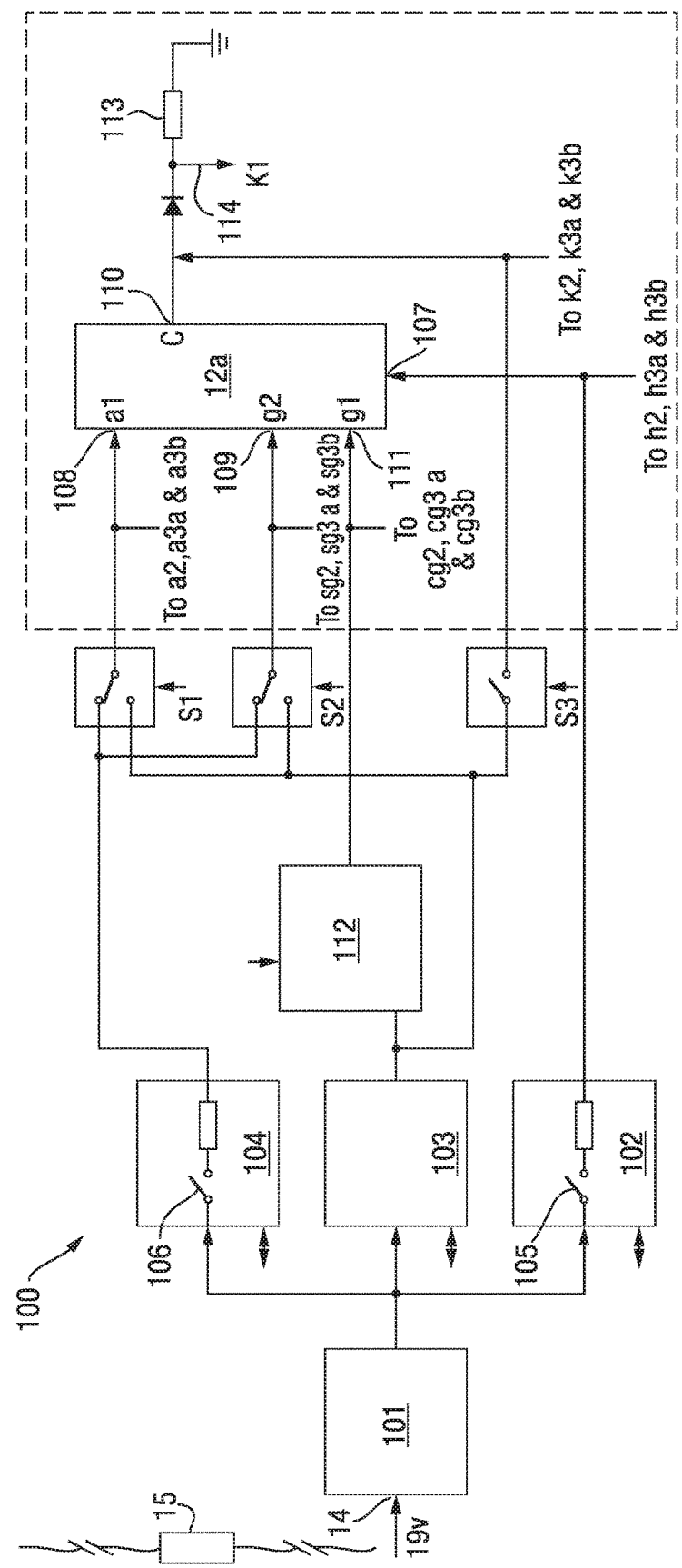
FIG. 2 is a diagram of part of the electrical circuitry of the device of FIG. 1.

As shown in FIG. 2, the circuitry 100 has a filter 101 which is connected to the power supply socket 14 for smoothing the power supply. The output of the filter 101 is connected to three voltage regulators 102, 103, 104 and switches 105, 106 are provided on the input side of two of the three voltage regulators 102, 104 to isolate these voltage regulators from one another. Each of the voltage regulators 102, 103, 104 also includes a current limiter (not shown in FIG. 2). The voltage regulators are not linear voltage regulators and instead are switching type regulators.

The first voltage regulator 102 (which is described in greater detail with reference to FIG. 4a) is connected to the heater terminals 107 of the valve socket 12a. The regulator 102 converts the input DC voltage supply to the required voltage for the heater/heating filament of the thermionic valve. Typically the regulator 102 converts the input DC voltage to between 4 and 12.6 volts, depending upon valve type and its heater voltage requirements.

The second voltage regulator 103 is used to generate a negative biasing voltage (typically −85V) required for certain tests during the testing procedure. The output of the second voltage regulator 103 is connected to the anode terminal 108, the screen grid terminal 109 and the cathode terminal 110 of the valve socket 12a in each case via a switch S1, S2, S3. The output of the second voltage regulator 103 is also connected to the control grid terminal 111 of the valve socket 12a via a grid bias adjustment unit 112.

The third voltage regulator 104 is an adjustable high voltage DC generator (HT generator) which is connected via switches S1 and S2 respectively to the anode terminal 108 and the screen grid terminal 109 of the valve socket 12a. The third voltage regulator 104 converts the input power supply to an output power supply typically in the range of +100V to +400V and is described in greater detail with reference to FIG. 4b.

A low value resistor 113 of typically 1Ω is connected between the cathode terminal 110 of the valve socket 12a and earth, and line 114 taps off the voltage at the resistor which is dependent upon the current passing through the valve mounted in the valve socket 12a. A controller 115 (see FIG. 3) is connected to line 114 and monitors the voltage at line 114 during valve testing.

The controller 115 shown in FIG. 3 is a programmable microprocessor for processing digital signals in response to program control. In a preferred embodiment, the controller 115 is implemented as a pic (peripheral interface controller) processor, having a plurality of input ports, a plurality of output ports and internal non-volatile data storage 115a. One example of the non-volatile storage used by the controller 115 is electrically erasable programmable read only memory (E2PROM). Other forms of non-volatile data storage may alternatively be used, as appropriate, which may include external non-volatile data and program storage. In FIG. 3, the controller 115 has three input ports 116, one each for each valve socket 12 in the testing device 10. Additional input ports of the controller 115 include a port for receiving data regarding which valve socket is being used and has a valve connected to the socket and a port for receiving data from the user controls 16. One of the output ports of the controller 115 communicates with the display 13 to select which LEDs are to be lit.

One of the input ports 116 of the controller 115 is connected to line 114 so that the voltage input (K1) at input port 116 is representative of the cathode current of the valve in the valve socket 12a. Each one of the other input ports 116 is similarly connected to a voltage line associated with a different valve socket. Each input port 116 also includes a respective amplifying and buffering circuit (not shown) so that analog to digital conversion of the input analog signals is performed under program control.

Output ports 117, 118, 119 of the controller 115 supply digital control signals respectively to switches S1, S2 and S3 and output ports 120, 121 and 122 supply digital control signals respectively to the three voltage regulators 102, 103, 104. A further output port 123 is in communication with the grid bias adjustment unit 112. Voltage signals from each of the voltage regulators 102, 103 and 104 are also input to the controller 115 and, as with the input ports 116, respective amplifying and buffering circuits (not shown) are used to convert the input analog signals to digital.

In contrast to conventional valve testing equipment, the testing device 10 does not use linear regulators for setting the various voltages required for the different valve tests. Instead, as shown in FIGS. 4a and 4b, a buck converter and a boost converter are used respectively for the voltage regulators 102 and 104. The buck converter 102 consists of a capacitor $C_1$ connected to the low voltage power supply 15 and which is, in turn, connected to the valve heater 107. A transistor $FET_1$, controlled by the microprocessor 115, is used as a voltage limiter to control the power supplied to the valve heater 107. The controller 115 monitors for possible short circuits in the valve heater 107 at resistor $R_1$. The buck converter 102 steps the low voltage power supply down to between 4v and 12.6v which are the standard voltages required for conventional valve heaters.

In the case of thermionic valve heaters it is known that inrush currents can occur when the heater 107 is initially cold which will look like a heater short circuit to the controller 115 monitoring for high currents at $R_1$. The controller 115 is therefore programmed to adjust the pulse width of the transistor $FET_1$ to limit the initial current and if this adjustment results in the detected high current falling away the high initial current is presumed to be an inrush current. Thus, the controller 115 includes a timer (not shown) and the controller 115 is programmed to permit current to continue to be supplied to the heater 107, despite a detected short circuit, for a predetermined period of time. If the detected short circuit disappears during the predetermined time period, the temporary short circuit is ignored. This avoids the risk of false positive test results of a short circuit in the heater. If, however, the short circuit remains at the end of the predetermined time period the valve is deemed to have failed the heater test and the processor 115 is programmed to adjust the pulse width of the transistor $FET_1$ to pull back the current supplied to the heater 107.

As mentioned above, the voltage regulator 104 is a boost converter and consists of a capacitor $C_2$ which is connected to the low voltage power supply 15 and which is in parallel with a transistor $FET_2$, and a resistive potential divider $R_2$, $R_3$. The pulse width of the transistor $FET_2$ is controlled by the microprocessor 115 so that the transistor $FET_2$ acts as a diode pump to build up the energy stored in the capacitor $C_2$. The output of the capacitor $C_2$ is monitored by the controller 115 using the resistive potential divider $R_2$, $R_3$ so that any fall in voltage across the potential divider is accommodated through adjustment of the pulse width of the transistor $FET_2$. This boost converter 104 is adapted to step up the low voltage power supply of 19 volts to selected higher voltages up to and including 400 volts.

Optionally, the voltage regulator 103 is also a boost converter, similar to the boost converter 104, but with the diode connected in the opposite direction. The voltage regulator 103 preferably provides a fixed negative bias of −85 volts but may alternatively provide a variable negative bias under the control of the microprocessor 115.

Reference is made herein to the microprocessor 115 controlling all elements of the testing device circuitry. However, it is also envisaged that alternatively the voltage regulators may be controlled by separate dedicated processors in communication with a primary controller 115.

The testing device 10 is adapted to perform a series of tests on a thermionic valve to assess whether the valve is operating within normal parameters. The testing device 10 has valve performance criteria and all required test settings stored in the memory 115a of the microprocessor 115. This ensures that the testing device 10 is fully automated enabling use by people who lack the technical knowledge required by conventional valve testing equipment. The testing device 10 is programmed to perform a comprehensive range of tests to test the status of a thermionic valve and to test valve performance. The tests are designed to emulate actual operating conditions in an amplifier, for example, but involving much lower power consumption than conventional valve testing equipment. This enables the testing device 10 to use a low, e.g. between 10-48v, DC voltage power supply or battery power source, e.g. 6 rechargeable batteries each supplying 3.7 volts are sufficient for performing valve tests for around 1 hour. In use, a complete set of around 20 tests can be performed by the testing device in approximately 2 minutes. However, the controller 115 is programmed to use its timer to delay for a predetermined short time interval, e.g. 30 seconds or 1 minute, the display of the test results once the tests have been completed. This delay is used to allow the valve being tested time to cool down slightly. This ensures the valve can be safely handled when a user of the testing device 10 is motivated to remove the valve from the socket 12a by virtue of the test results being displayed.

During use, a valve is inserted into its corresponding socket 12a. If the socket is adapted to receive more than one type of valve, one of the LEDs on the display 13 lights up and the user then uses the left- and right-hand direction buttons 16 to change which LED is lit (by moving the light left or right) until the LED aligned with the valve name for that particular valve is lit. The user then presses the central button 16 to activate the test.

The tests performed by the testing device 10 include tests similar to those described in GB 481601, the content of which is incorporated herein by reference. The initial status tests performed by the testing device 10 include but are not limited to one or more of the following:

High voltage breakdown. This tests for arcing ('flashover') between the electrodes in the valve due to mechanical short-circuits. Arcing can arise when there is electrical leakage as a result of a low resistance path across the insulating retainers or when air or other gas molecules are present in the evacuated envelope which are ionized in the presence of a high voltage. Arcing is a severe failure mode which can cause major damage to an amplifier.

Filament continuity. This tests for a break in the electrical circuit of the heating filament which results in little or no thermionic emission by the valve cathode.

Filament over-current. This checks whether parts of the heating filament are touching which effectively shortens the resistance path and results in less heat output.

Heater to cathode insulation breakdown. This tests for a short circuit or a low resistance path between the heating filament and the cathode electrodes.

Cathode to control grid (g1) breakdown. This tests for a short circuit or a low resistance path between the cathode electrodes and the control grid electrode.

Adjacent electrode breakdown. This tests for a short circuit or a low resistance path or leakage between any two electrodes in the valve.

Gas ionization test.

The arc test is one of the first tests performed by the device 10 because it is performed with the valve heater cold. The controller 115 ramps up the voltage supplied by the voltage regulator 104 to the valve electrodes to around 375 volts, whilst biasing the valve control grid to the maximum negative supply, e.g. −85 volts. The controller 115 then holds the electrodes at these voltages for a short period of time, e.g. 20 seconds. A valve that flashes over will quickly draw all available current and so the controller 115 monitors for current flow within the valve. As the voltage regulator 104 is a boost converter under the control of the controller 115 by means of the transistor $FET_2$, if current flow is detected the controller 115 is able to shut off the power supply to the HT capacitor $C_2$ by adjusting the pulse width of the transistor $FET_2$. Thus the boost converter 104 is current regulated by the controller 115 and, using the transistor $FET_2$, the controller 115 is capable of shutting off power supply to the valve with a response time of around 1 second thereby minimizing the risk of an explosive failure of the valve.

If any fault condition is detected with any of the initial tests, the controller 115 flags the fault, aborts the test and instructs a failure warning to be displayed by the display 13, by activating the LED 13*b* associated with "FAIL". Data on the fault may also be downloaded from the testing device 10 via a data port/transmitter (not illustrated).

If a fault condition is not detected, the testing device 10 then goes on to perform one or more additional valve condition tests under simulated working conditions. Once the one or more condition tests for that particular valve type are completed, the results of the valve condition tests are then combined to generate a condition value which is representative of the condition of the valve. For different types of valves different groups of tests are performed because different measurable valve characteristics are more or less relevant to the condition of different types of valves. In this way the resultant valve condition value is an accurate measure of the condition of the valve with respect to its ability to do the work expected of it. With the testing device 10 shown in FIG. 1 the valve condition value is a value in the range 1-15 (corresponding to the number of valve condition LEDs 13*a* in the display 13). Once the valve condition value has been determined the controller 115 causes the display 13 to display the results of the valve condition tests by lighting the LED 13*a* corresponding to that condition value (subject to the predetermined delay mentioned earlier). It will be appreciated that the range of valve condition values is not limited to 1-15 and that a different range of values may be used instead, as appropriate.

For some types of valve the mutual conductance or 'gm' value of a valve is a key characteristic. The gm value is measured using the grid bias adjustment unit 112 which is described in greater detail in GB 2462368, the contents of which is incorporated herein by reference. To measure a valve's mutual conductance, once the valve filament is heated to its normal working temperature, using a digital to analogue (D to A) converter the voltage supplied by the grid bias adjustment unit 112 to the valve control grid g1 is automatically adjusted up or down in small increments until a pre-programmed cathode current is obtained. Once the pre-programmed cathode current has been achieved, the controller 115 stores the voltage D to A value for the pre-programmed cathode current. The process is then repeated for a second different pre-programmed cathode current (typically 1 to 10 mA difference between the two pre-programmed cathode current values, depending on the type of valve under test). Once the second pre-programmed cathode current is reached the new voltage D to A value is recorded. The mutual conductance value, which is a measure of how good the valve is at amplifying audio signals, is then calculated using the two voltage D to A values and the difference in the two pre-programmed cathode currents. The calculated gm value is then compared to the manufacturer's published gm value for that valve. The size of the difference between the measured gm value and the manufacturer's published gm value is then used in determining the valve condition value as mentioned above.

For the avoidance of doubt, for different types of valve the gm valve test may be omitted and different tests, more representative of the operating requirements of that type of valve, may be performed but in all cases the results of the one or more tests are combined to determine a valve condition value which is then displayed by illuminating the corresponding LED 13*a*. Such tests include but are not limited to voltage gain, power gain and the screen grid. As mentioned earlier, this data may also be downloaded or otherwise output to an external device. This information may be used to 'match' valves, by pairing a valve with a valve having the same valve condition value.

Some smaller valves have two identical valves in one glass envelope. In this case, the two individual 'halves' of the valve are separately tested and the condition values for each half is displayed on the display 13. If the two halves of the valve are still matched then a single LED will light up as both halves of the valve will have the same valve condition value. However, if the two halves of the valve are no longer matched two separate LEDs will light up, each representative of the condition value for one half of the valve, and with the separation of the two LEDs (i.e. the difference in condition value) being representative of the extent of the mismatch.

Additional normal condition tests include: a test for electrode continuity where a high negative voltage is applied to each electrode in turn to make sure that the valve turns off; and an emission test using a High Tension power supply to ensure that the valve can supply the maximum rated current at a simulated maximum signal drive. With conventional valve testers the emission test is performed by turning the valve on as hard as possible and measuring the current in the valve. However, this test risks damage or destruction of the valve under test. In contrast, with the testing device 10 described herein a pulsed HT power supply is used when performing an emission test. The boost converter 104 is used to deliver 375 volts to the valve anode with the grid bias set to between 20 mA and 60 mA. However, the microprocessor 115 controls the transistor $FET_2$, so that the HT supply to the anode is pulsed, preferably within the range 5 and 100 ms, for example every 20 ms. This enables the testing device 10 to avoid the risk of overheating the valve during the test. The current within the valve is monitored as usual but ideally only the leading edge of the resultant pulsed current data is used in determining the valve condition value.

Optionally, each of the valve sockets 12 of the testing device 10 includes a piezo-electric transducer mount or other support to which a high frequency mechanical vibration may be applied. This simulates the effect on the valve of being placed close to an amplifier speaker and enables the valve to be tested for microphonic characteristics. Applying a DC pulse or AC stimulus to the piezo-electric transducer causes the electrodes within the valve to be vibrated in synchronism with the stimulus signal. Any tendency of the valve to produce microphonic noise can be detected as a high frequency electrical signal at the valve anode which can be further amplified and either incorporated into the valve condition value or output as a separate test result.

The various valve tests are preferably stored as a plurality of algorithms optimized for individual valve types and optimized to minimize power consumption. As mentioned earlier, the manufacturer's parameters for each type of valve are stored in the memory of the microprocessor 115 of the testing device 10. The data port (not shown) enables additional valve data or changes to the manufacturer's parameters to be added to the microprocessor memory 115*a*. The data port may also be used to output more detailed valve performance data such as curve tracing of the valve performance as an analysis tool.

Before any normal valve condition tests are performed, a predetermined time delay is triggered to enable heating of the valve cathode up to its normal operating temperature. The heater voltage and the cathode current are compared with stored manufacturer's data and if matching or within a permitted deviation of the data, the tests are then performed.

A serviceable valve is expected to pass all of the status tests and all of the valve condition tests assigned to that type of valve as well as being within the spread of normal performance parameters as stored in the testing device 10.

The spread in normal parameters allows for production tolerances, for example a characteristic spread for gm is +/−40%, for anode current is +/−20% and for heater current is +/−10% with respect to published manufacturer's norms.

The testing device derives all the voltages used in its tests from a low voltage DC power supply. The low voltage power supply may be in the form of a low voltage power supply lead incorporating a universal adapter for connection to an AC mains supply, for example a 19V laptop power supply or equivalent. Alternatively the testing device may be powered by a local battery supply, as described earlier. Whilst the exemplary embodiment utilizes a single power supply socket for connection to an external power supply that supplies power to all of the components of the testing device, it is also envisaged that a local (i.e. on-board) battery supply may additionally be included to supply power to one or more low-power components of the testing device. This offers the additional advantage that the testing device can be used in any part of the world without manual adjustment to accommodate variations in local mains supply. The testing device is small which makes it readily portable and as all technical data is embedded within the testing device it is suitable for use by people lacking the technical knowledge and skills to operate conventional valve testing equipment. The testing device is suitable for testing thermionic valves used in audio amplification systems including valves for guitar amplifiers, radios and other audio amplification equipment, particularly high fidelity audio equipment, as well as signal valves generally and low to medium power valves.

Although only one exemplary embodiment of the present invention has been described in detail above accompanied by examples of changes that may be made to the embodiment, those skilled in the art will readily appreciate that many other modifications are possible in the exemplary embodiment without departing from the novel teachings and advantages of the present invention. Accordingly, all such modifications are intended to be included within the scope of the present invention as defined in the following claims.

The invention claimed is:

1. A thermionic valve tester comprising:
at least one valve socket having a plurality of valve electrode terminals adapted for connection with the electrodes of a thermionic valve;
a single power supply terminal adapted for connection to an external low-voltage DC power supply for receiving low-voltage DC power therefrom and providing the sole source of power to the valve tester;
a first voltage regulator having a switchable connection with at least one valve electrode terminal of the valve socket, the voltage regulator being adapted to supply at least two different predetermined valve electrode voltages;
a controller for controlling connection of the first voltage regulator with at least one of the valve electrode terminals and for monitoring current flow in a thermionic valve mounted in the valve socket; and
a display in communication with the controller for displaying the test results for a thermionic valve; and
the controller is adapted to calculate a condition value and to cause the condition value to be displayed by the display, the condition value being based upon the performance of a valve in response to one or more tests, the condition value being calculated to be representative of a condition of the valve to operate to an expected performance ability for a type of valve being tested, and the condition value being representative of the valve having the calculated condition value that matches a condition value of a second valve, wherein the second valve is a same type as the valve being tested and from which the condition value was calculated,
wherein the display is adapted for displaying the calculated condition value in addition to the test results.

2. The thermionic valve tester as claimed in claim 1, further comprising a second voltage regulator having a switchable connection with at least one valve electrode terminal of the valve socket, wherein the single power supply terminal supplies power to both the first and second voltage regulators.

3. The thermionic valve tester as claimed in claim 1, wherein the power supply terminal is adapted for connection to a DC power supply between 10 and 48 volts.

4. The thermionic valve tester as claimed in claim 3 wherein the power supply connector is adapted for connection to a universal low voltage DC power supply.

5. The thermionic valve tester as claimed in claim 1, wherein the power supply terminal is adapted for connection to a battery supply.

6. The thermionic valve tester as claimed in claim 1, wherein the first voltage regulator is a switched voltage regulator.

7. The thermionic valve tester as claimed in claim 6, wherein the first voltage regulator includes a transistor and the controller is adapted to control the pulse width of the transistor so as to alter the voltage supplied by the first voltage regulator to at least one of the valve electrode terminals.

8. The thermionic valve tester as claimed in claim 7, wherein the first voltage regulator is adapted to supply a pulsed HT voltage to a valve anode terminal and the controller is adapted to monitor current flow in the thermionic valve in response to the pulsed HT voltage, the current flow being representative of thermionic emission of the valve cathode.

9. The thermionic valve tester as claimed in claim 2, wherein the second voltage regulator has a switchable connection with a valve heater terminal in the valve socket, the second switched voltage regulator having a transistor and the controller being adapted to control the pulse width of the transistor and to monitor current flow from the second voltage regulator to the valve heater terminal and wherein the controller is further adapted to shut down current supply from the second switched voltage regulator to the valve heater terminal when a high current flow to the valve heater terminal, representative of a short circuit in the valve heater, is detected by the controller.

10. The thermionic valve tester as claimed in claim 9, wherein the controller further includes a timer and the controller is adapted to delay shutting down current supply to the valve heater terminal for a predetermined time period after high current flow representative of a short circuit is detected.

11. The thermionic valve tester as claimed in claim 1, further comprising a memory in which is stored: a plurality of different valve tests, each stored valve test including voltage settings for the valve electrodes; and wherein the controller is adapted to access at least one of the valve tests from memory and to cause the first voltage regulator to supply an electrode terminal with a voltage according to the voltage settings for the valve test.

12. The thermionic valve tester as claimed in claim 11, wherein the memory further has stored within it one or more expected performance characteristics for a thermionic valve in response to one or more valve tests and wherein the controller is further adapted to: monitor the performance of a thermionic valve being tested; compare the monitored performance with the stored expected performance characteristics; and output the result of the comparison.

13. The thermionic valve tester as claimed in claim 12, wherein the output of the controller is selected from: Fail, Worn or Good.

14. The thermionic valve tester as claimed in claim 11, wherein the condition value is based upon the difference between the monitored performance of a valve in response to one or more valve tests and stored expected performance characteristics.

15. The thermionic valve tester as claimed in claim 1, wherein the valve tester is portable.

16. A method of testing a thermionic valve using a valve tester, the method comprising the steps of:
   connecting a single power supply terminal of the valve tester to a low-voltage DC power supply and receiving low-voltage DC power therefrom and providing the sole source of power to the valve tester;
   connecting the pins of a thermionic valve to the electrode terminals in a valve socket of the valve tester;
   supplying from a first voltage regulator to at least one of the electrode terminals a first voltage which is different from the low voltage DC power supply and thereafter supplying from the first voltage regulator to at least one of the electrode terminals a second voltage which is different from both the first voltage and the low voltage DC power supply;
   monitoring by means of a controller current flow in the thermionic valve;
   calculating a condition value automatically by the controller, the condition value being based upon a performance of the valve responsive to one or more tests, each test including the steps of supplying and monitoring, the condition value being calculated to be representative of a condition of the valve to operate to an expected performance ability for a type of valve being tested; and
   displaying the condition value, the condition value being representative of the valve having the calculated condition value that matches a condition value of a second valve, wherein the second valve is a same type as the valve being tested and from which the condition value was calculated.

17. The method as claimed in claim 16, further comprising supplying power from the power supply terminal to the first voltage regulator and to a second voltage regulator and supplying from the second voltage regulator to at least one of the electrode terminals a third voltage which is different from the low voltage DC power supply and the first and second voltages.

18. The method as claimed in claim 16, wherein the step of connecting a single power supply terminal of the valve tester to a low voltage DC power supply comprises connecting the single power supply terminal to a DC power supply between 10 and 48 volts.

19. The method as claimed in claim 18 wherein the step of connecting a single power supply terminal of the valve tester to a low voltage DC power supply comprises connecting the single power supply terminal to a universal low voltage DC power supply.

20. The method as claimed in claim 16, wherein the step of connecting a single power supply terminal of the valve tester to a low voltage DC power supply comprises connecting the single power supply terminal to a battery supply.

21. The method as claimed in claim 16, wherein the step of supplying a first voltage to at least one of the electrode terminals and thereafter supplying a second voltage to at least one of the electrode terminals comprises adjusting a switched voltage regulator.

22. The method as claimed in claim 21, wherein adjusting the switched voltage regulator comprises controlling the pulse width of a transistor of the switched voltage regulator.

23. The method as claimed in claim 22, further comprising supplying a pulsed HT voltage to a valve anode terminal and monitoring current flow in the thermionic valve in response to the pulsed HT voltage, the current flow being representative of thermionic emission of the valve cathode.

24. The method as claimed in claim 17, wherein the second voltage regulator is a switched voltage regulator and is used to supply a voltage to a valve heater terminal in the valve socket, the method further comprising monitoring current flow from the second switched voltage regulator to the valve heater terminal and shutting down the current supply from the second switched voltage regulator to the valve heater terminal by adjusting the pulse width of a transistor of the second switched voltage regulator when a high current flow to the valve heater terminal representative of a short circuit in the valve heater is detected.

25. The method as claimed in claim 24, further comprising delaying the shutting down of the current supply to the valve heater terminal for a predetermined time period after high current flow representative of a short circuit is detected.

26. The method as claimed in claim 17, further comprising accessing from data storage one or more valve tests each stored valve test including voltage settings for the valve electrodes, and supplying to an electrode terminal a voltage according to the voltage settings for the valve test.

27. The method as claimed in claim 26, further comprising monitoring the performance of a thermionic valve being tested; comparing the monitored performance with expected performance characteristics stored in the data storage; and outputting the result of the comparison.

28. The method as claimed in claim 27, wherein the result of the comparison is output as one of: Fail, Worn or Good.

29. The method as claimed in claim 26, wherein the condition value is based upon the difference between the monitored performance of a valve in response to one or more valve tests and stored expected performance characteristics.

30. The method as claimed in claim 27, wherein the condition value is based upon the difference between the monitored performance of a valve in response to one or more valve tests and stored expected performance characteristics.

31. The thermionic valve tester as claimed in claim 12, wherein the condition value is based upon the difference between the monitored performance of a valve in response to one or more valve tests and stored expected performance characteristics.

* * * * *